US006929867B2

(12) United States Patent
Armitage et al.

(10) Patent No.: US 6,929,867 B2
(45) Date of Patent: Aug. 16, 2005

(54) HAFNIUM NITRIDE BUFFER LAYERS FOR GROWTH OF GAN ON SILICON

(75) Inventors: Robert D. Armitage, Kyoto (JP); Eicke R. Weber, Piedmont, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 10/439,952

(22) Filed: May 16, 2003

(65) Prior Publication Data

US 2004/0077165 A1 Apr. 22, 2004

Related U.S. Application Data

(60) Provisional application No. 60/381,388, filed on May 17, 2002.

(51) Int. Cl.[7] .......................... B21D 39/00; B32B 15/04
(52) U.S. Cl. ...................................... 428/622; 428/627
(58) Field of Search ............................. 117/84, 88, 106, 117/952; 428/615, 620, 621, 622, 627, 689, 698, 699, 700, 704

(56) References Cited

U.S. PATENT DOCUMENTS

| 5,290,393 | A | | 3/1994 | Nakamura et al. |
| 5,369,289 | A | | 11/1994 | Tamaki et al. |
| 5,578,839 | A | | 11/1996 | Nakamura et al. |
| 5,665,628 | A | * | 9/1997 | Summerfelt .................... 438/3 |
| 5,670,798 | A | | 9/1997 | Schetzina |
| 5,729,054 | A | * | 3/1998 | Summerfelt et al. ........ 257/751 |
| 5,767,581 | A | | 6/1998 | Nakamura et al. |
| 5,793,057 | A | * | 8/1998 | Summerfelt ................. 257/55 |
| 6,013,937 | A | | 1/2000 | Beintner et al. |
| 6,133,589 | A | | 10/2000 | Krames et al. |
| 6,207,486 | B1 | | 3/2001 | Nishiyama |
| 6,233,265 | B1 | * | 5/2001 | Bour et al. .................... 372/45 |
| 6,306,762 | B1 | | 10/2001 | Nakamura et al. |
| 6,333,598 | B1 | * | 12/2001 | Hsu et al. .................... 313/495 |
| 6,342,404 | B1 | * | 1/2002 | Shibata et al. ................ 438/46 |
| 6,345,063 | B1 | | 2/2002 | Bour et al. |
| 6,359,919 | B1 | | 3/2002 | Ishikawa et al. |
| 6,426,412 | B1 | | 7/2002 | Ito et al. |
| 6,426,512 | B1 | * | 7/2002 | Ito et al. ....................... 257/12 |
| 2002/0070383 | A1 | * | 6/2002 | Shibata et al. ................ 257/76 |
| 2003/0134447 | A1 | * | 7/2003 | Shibata et al. ................ 438/46 |

FOREIGN PATENT DOCUMENTS

| JP | 410326940 A | 12/1998 | |
| JP | 2000-323753 | * 11/2000 | ........... H01L/33/00 |

OTHER PUBLICATIONS

Beresford, et al., Journal of Crystal Growth, 178, pp. 189–200 (1997).
Armitage, et al., Applied Physics Letter, vol. 81, No. 8, (Aug. 19, 2002).

(Continued)

*Primary Examiner*—Benjamin L. Utech
*Assistant Examiner*—Matthew Anderson
(74) *Attorney, Agent, or Firm*—Charles A. Nold; Berkeley National Laboratory

(57) ABSTRACT

Gallium nitride is grown by plasma-assisted molecular-beam epitaxy on (111) and (001) silicon substrates using hafnium nitride buffer layers. Wurtzite GaN epitaxial layers are obtained on both the (111) and (001) HfN/Si surfaces, with crack-free thickness up to 1.2 Om. However, growth on the (001) surface results in nearly stress-free films, suggesting that much thicker crack-free layers could be obtained.

7 Claims, 2 Drawing Sheets

OTHER PUBLICATIONS

Amano, et al., JPN. J. Appl. Phys., vol. 28, No. 12., pp. L2112–L2114 (1989).

Nakamura, et al., JPN. J. Appl. Phys., vol. 31 pp. L139–L142 (1992).

Sudhir, et al., Mat. Res. Soc. Symp. Proc. vol. 482, Materials Research Society, pp. 525–530 (1998).

Kim et al., Mat. Res. Soc. Symp. Proc. vol. 482, Materials Research Society, pp. 217–222 (1998).

Kruger, et al., Mat. Res. Soc. Symp. Proc. vol. 482, 1998 Materials Research Society, pp. 447–452 (1998).

Anders, et al., Plasma Sources Science Technology, vol. 4., pp. 571–575 (1995).

Ng, et al., Mat. Res. Soc. Symp. Proc. vol. 482, Materials Research Society, pp. 507–512 (1998).

Kisielowski., Jpn. J. Appl. Phys, vol 36 Pt. 1, No. 11., pp. 6932–6936 (1997).

Cho, et al., Mat. Res. Soc. Symp. Proc. vol. 482, Materials Research Society, pp. 45–50 (1998).

Mohammad, et al., Prog. Quant. Electr., vol. 20., No. 5/6 pp. 361–419 (1996).

Beresford, et al., *Journal of Crystal Growth*, 178, pp. 189–200 (1997).

Armitage, et al., *Applied Physics Letter*, vol. 81, No. 8, (Aug. 19, 2002).

Nakamura, S. et al., Jpn. J. Appl. Phys., vol. 34, pp. L797–L799, (1995).

Amano, H. et al., Jpn. J. Appl. Phys., vol. 28, pp. L2112–L2114, (1989).

Nakamura, S. et al., Jpn. J. Appl. Phys., vol. 31, pp. L139–L142, (1992).

Sudhir, G.S. et al., Mat. Res. Symp. Proc., vol. 482, pp. 525–530, (1998).

Kim, Y. et al., Mat. Res. Symp. Proc., vol. 482, pp. 217–222, (1998).

Krueger, J. et al., Mat. Res. Symp. Proc., vol. 482, pp. 447–452, (1998).

Anders, A. et al., Plasma Sources Sci. Technol., vol. 4, pp. 571–575, (1995).

Ng, H.M. et al., Mat. Res. Symp. Proc., vol. 482, pp. 507–512, (1998).

Kisielowski, C. et al., Jpn. J. Appl. Phys., Part 1, vol. 36, pp. 6932–6936, (1997).

Cho, Y. et al., Mat. Res. Symp. Proc., vol. 482, pp. 45–50, (1998).

Mohammed, S.N. et al., Prog. Quant. Electr., vol. 20, No. 5/6, pp. 361–362, pp. 418–419, (1996).

\* cited by examiner

US 6,929,867 B2

HAFNIUM NITRIDE BUFFER LAYERS FOR GROWTH OF GAN ON SILICON

PRIORITY

This application claims priority to U.S. Ser. No. 60/381,388, filed May 17, 2002, the contents of which are hereby incorporated by reference in their entirety.

STATEMENT REGARDING FEDERALLY SPONSORED RESEARCH OR DEVELOPMENT

This invention was made with government support under Grant (Contract) No. DE-AC03-76F00098 awarded by The United States Department of Energy to The Regents of the University of California. The government has certain rights to this invention.

BACKGROUND OF THE INVENTION

Recently, there has been enormous interest in growth of Group III nitride, and particularly gallium nitride (GaN) thin films, Jpn. J. Appl. Phys. Vol. 34 (1995) pp. L 797–L 799. GaN, and related (Aluminum, Indium)N alloys are being utilized for the production of efficient optoelectronic devices, e.g. light emitters and detectors spanning the spectral range of visible to deep ultra-violet (UV). In addition, the direct wide bandgap and the chemical stability of Group III nitrides are very beneficial for high-temperature and high-power operated electronic devices, e.g. hetero-junction bipolar and field effect transistors. However, the poor material quality of GaN severely limits the efficiency of such devices.

When GaN is directly grown on a sapphire substrate, the growth mode is three-dimensional due to the large lattice mismatch, the chemical dissimilarity, and the thermal expansion difference. The layer contains structural defects such as, threading dislocations, stacking faults, and point defects. These defects degrade the film's morphology and optical and electrical properties. In order to achieve high quality epitaxial growth, researchers have introduced a thin low-temperature grown AlN or GaN layer serving as a buffer layer. This layer provides nucleation sites for subsequent two-dimensional GaN growth at higher temperatures, see H. Amano, M. Kito, K. Hiramatsu, and I. Akasaki, Jpn. J. Appl. Phys. 28, L2112 (1989) and S. Nakamura, T. Mukai, M. Senoh, and N. Isawa, Jpn. J. Appl. Phys. 31, L139 (1992). Therefore, the control of buffer layer growth is the most important step in the improvement of GaN main layer properties. The effect of buffer layer thickness and growth temperature on GaN main layer properties has been well studied: G. S. Sudhir, Y. Peyrot, J. Krüger, Y. Kim, R. Klockenbrink, C. Kisielowski, M. D. Rubin and E. R. Weber, Mat. Res. Symp. Proc. 482, pp. 525–530 (1998); Y. Kim, R. Klockenbrink, C. Kisielowski, J. Krüger, D. Corlatan, Sudhir G. S., Y. Peyrot, Y. Cho, M. Rubin, and E. R. Weber, Mat. Res. Symp. Proc. 482, pp. 217–222 (1998); J. Krüger, Sudhir G. S., D. Corlatan, Y. Cho, Y. Kim, R. Klockenbrink, S. Rouvimov, Z. Liliental-Weber, C. Kisielowski, M. Rubin and E. R. Weber, Mat. Res. Symp. Proc. 482 pp. 447–452 (1998). Buffer layers for Group-III nitride growth has been discussed in Mohammad et al., "Progress and Prospects of Group-III Nitride Semiconductors", Prog. Quant. Electr. 1996, Vol. 20, No. 5/6 pp. 418–419, hereby incorporated by reference in its entirety. Various buffer materials are disclosed. Not disclosed or fairly suggested is a buffer layer of HfN.

Group III nitride semiconductors are discussed generally in Mohammad et al., "Progress and Prospects of Group-III Nitride Semiconductors", Prog. Quant Electr. 1996, Vol. 20, No. 5/6 pp. 361–525, the contents of which are hereby incorporated in its entirety.

Other U.S. patents relevant to the state of the art include U.S. Pat. Nos. 5,369,289; 6,133,589; 5,767,581; 6,013,937; 5,578,839 and 5,290,393. U.S. Pat. No. 5,369,289 discloses a gallium nitride based compound semiconductor light emitting device comprising a buffer layer of a gallium nitride compound. U.S. Pat. No. 6,133,589 discloses an AlGaInN based light emitting diode having a buffer layer comprising a AlGaInN-based material. U.S. Pat. No. 5,767,581 discloses a gallium nitride based III–V group compound semiconductor having an ohmic electrode comprising a metallic material. U.S. Pat. No. 6,013,937 discloses a silicon wafer having a buffer layer formed on the dielectric layer. U.S. Pat. No. 5,578,839 discloses a gallium nitride based compound semiconductor device. U.S. Pat. No. 5,290,393 discloses a gallium nitride based compound semiconductor having a buffer layer of GaAlN. The above-mentioned references and U.S. patents are hereby incorporated by reference into this specification in their entirety.

Epitaxy of GaN on silicon offers a considerable cost advantage relative to growth on sapphire or SiC and the potential for monolithic integration of GaN-based devices with conventional microelectronics. However, Si substrates present additional challenges for GaN growth. Thick (>1 $\mu$m) GaN epilayers often crack upon cooling to room temperature due to the severe tensile stress induced by the ~35% smaller thermal expansion coefficient of Si. Additionally, gallium exhibits poor wetting on the Si surface and exposed regions are converted to amorphous $SiN_x$, disrupting epitaxy. Therefore low-temperature GaN (as typically employed on sapphire) is not an effective buffer layer for Si substrates and other materials must be considered. Buffer materials investigated include AlN, SiC, AlAs, intentionally formed $SiN_x$, and BP. The best results by far have been achieved with the AlN buffer layer process, leading to the demonstration of high-brightness blue light-emitting diodes on Si. However, the mutual solubility of Si and Al is high at the buffer layer temperature (eutectic point 577C). Therefore AN may exacerbate interdiffusion at the interface, which results in high unintentional doping levels in both the film and substrate. These drawbacks merit further investigation of alternative buffer layers.

BRIEF SUMMARY OF THE INVENTION

The invention described herein demonstrates that hafnium nitride is an effective buffer layer for GaN on Si, with epilayer quality comparable to typical results achieved using AlN buffer layers. The invention described herein provides for superior diffusion resistance, closer lattice match, and metallic conductivity of HfN over AlN buffer layers for certain applications

DETAILED DESCRIPTION OF THE INVENTION

Figure 1:
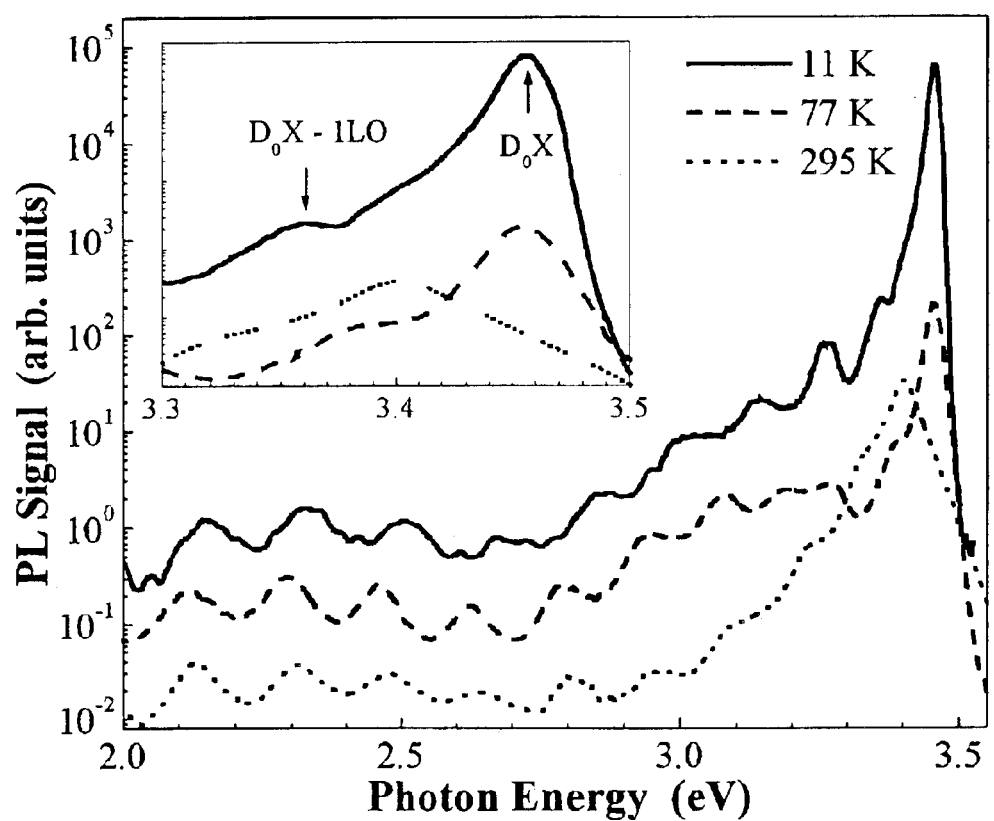
FIG. 1 shows photoluminescence spectra for an intact region of a cracked 1.5 $\mu$m GaN layer on HfN (111).

The current invention contemplates a composite wafer comprising a substrate comprising Si, a buffer layer comprising HfN overlying said Si substrate, and a GaN layer grown on said buffer layer. In another embodiment it is contemplated that there be more than one buffer layer comprising HfN, including two buffer layers touching one another. In a preferred embodiment the buffer layer of HfN has the (111) crystal structure and a layer of GaN with a wurtzite crystal polytype layer grown on said buffer layer.

Hafnium nitride has the NaCl-type structure, a lattice constant of 0.452 nm, and a mismatch of only +0.35% for GaN(0001)/HfN(111). It is a refractory metal and has been studied as a diffusion barrier in Si technology. Due to the small (0.02%) mismatch for the coincident-site lattice involving 6 HfN unit cells and 5 Si unit cells, HfN can be grown epitaxially on Si, see S. Shinkai and K. Sasaki, *Jpn. J. Appl. Phys.* Part 1 38, 2097 (1999), the contents of which are hereby incorporated by reference in its entirety. Like AlN, HfN is stable with regard to formation of $Si_3N_4$, but should offer better diffusion resistance. Accordingly, one unexpected benefit of the instant invention is that its metallic conductivity could make possible novel GaN devices such as metal base transistors or resonant tunneling devices, and provide a built-in n-type contact to facilitate processing of conventional devices.

In one embodiment of the instant invention epitaxial hafnium nitride films of 200 nm thickness were deposited by reactive dc magnetron sputtering on Si(111) and (001) substrates using the process of Shinkai and Sasaki, cited above. It is emphasized that this process was not originally intended to prepare buffer layers for GaN growth, and the 450 C HfN deposition temperature was the practical maximum for the deposition chamber rather than the optimum for HfN epitaxy. The HfN stoichiometry was confirmed by x-ray photoelectron spectroscopy and the cube-on-cube epitaxial relationship was verified by x-ray diffraction. Rocking curves for the films were broad (~1 deg), and a lateral grain size of ~50 nm was determined by scanning tunneling microscopy. Improved structural quality would be expected using a higher HfN growth temperature.

By "grown" it is meant that meaning that is normally associated with deposition of GaN in the art, including those techniques described and incorporated herein.

Composite wafers made according to one embodiment of this invention had GaN grown on HfN templates performed by molecular-beam epitaxy (MBE) using a Ga effusion cell and an Applied Epi rf nitrogen plasma source. Plasma operating conditions were 225 W, 1.5 sccm $N_2$ flow and chamber pressure of $5 \times 10^{-5}$ torr, giving a nitrogen-limited growth rate of 0.6 μm/hour. The base pressure excluding hydrogen was $5 \times 10^{-10}$ torr. The substrate temperature was estimated by pyrometry, taking the HfN emissivity as 0.15. Prior to initiating growth the substrates were exposed to nitrogen plasma for 5 min. A 5 nm GaN layer was deposited at 500 C, and the temperature increased to 740 C over a 2 minute interval without growth interruption. Finally 1.0–1.5 μm thick nominally undoped GaN films were grown.

Mirror-like surfaces were observed for GaN on both (111) and (001)HfN/Si substrates. Atomic force microscopy showed an rms roughness of 10 nm and morphology similar to that of optimized MBE-GaN grown on sapphire. For this particular growth process, the maximum crack-free layer thickness was 1.0 μm on Si(111) and at least 1.2 μm on Si(001). Other non-limiting examples of techniques for growth of HfN suitable for use with this invention include include rf glow discharge sputtering, dc glow discharge sputtering, pulsed laser ablation, chemical vapor deposition (effective precursor molecules would be $NH_3$ and $HfCl_4$) and reactive electron beam evaporation Typical (0002) and (10–11) double-crystal x-ray rocking curve widths for GaN on HfN/Si(111) were 19 and 20 arcmin, respectively. Typical (0002) rocking curve widths for optimized GaN on AlN/Si(111) range from 8–16 arcmin, although a value of 14 arcsec was reported for a process employing AlGaN/GaN superlattices, see S. A. Nikishin, N. N. Faleev, V. G. Antipov, S. Francoeur, L. Grave de Peralta, G. A. Seryogin, H. Temkin, T. I. Prokofyeva, M. Holtz, and S. N. G. Chu, *Appl. Phys. Lett.* 75, 2073 (1999), the contents of which are hereby incorporated by reference in their entirety for all purposes. For GaN-on-sapphire, it is art recognized that the asymmetric rocking curve actually shows better correlation with the threading dislocation density. Asymmetric rocking curve widths of 10 arcmin for the (10–12) reflection, (see C. A. Tran, A. Osinski, R. F. Karlicek, Jr., and I. Berishev, *Appl. Phys. Lett.* 75, 1494 (1999), the contents of which are hereby incorporated by reference in its entirety for all purposes), and 13 arcmin for the (20–21) reflection, (see H. Marchand, L. Zhao, N. Zhang, B. Moran, R. Coffie, U. K. Mishra, J. S. Speck, S. P. DenBaars, and J. A. Freitas, *J. Appl. Phys.* 89, 7846 (2001), the contents of which are hereby incorporated by reference in its entirety for all purposes), were reported for GaN on AlN/Si(111) grown by metal-organic vapor phase epitaxy (MOVPE). The larger width of 20 arcmin achieved on HfN(111) might be attributed to the small grain size of the buffer layer. On the other hand, MOVPE generally yields better asymmetric rocking curves than MBE, and a fair evaluation of the HfN buffer layer should involve GaN films grown by the same technique with similar substrate temperatures.

Typical Si wafers contemplated by this invention range in thickness from 200–400 μm. The Si contemplated for the instant invention includes any crystal orientation, including (001) and (111). The HfN layer is preferred to be about 0.2 μm, but suitable thicknesses for use with this invention range from between 5 nm and 1 micron. Naturally, it is preferable that the GaN layer be thick. The instant invention contemplates thicknesses for the GaN film to range from 100 nm to over 1.2 microns, even up to 1.5 and 2 microns.

Photoluminescence spectra for an intact region of a cracked 1.5 μm GaN layer on HfN (111) are shown in FIG. 1. The excitation wavelength was 325 nm with an optical power of ~10 mW/cm². The band-edge emission at 295 K has a width of 50 meV and is much stronger than the yellow deep-level luminescence. The intensity oscillations with photon energy result from a Fabry-Perot cavity formed by the GaN/HfN and GaN/air interfaces, see A. Billeb, W. Grieshaber, D. Stocker, E. F. Schubert, and R. F. Karlicek Jr., *Appl. Phys. Lett.* 70, 2790 (1997), the contents of which are hereby incorporated by reference in its entirety for all purposes. The large amplitude of the oscillations attests to the high interface quality. At 11 K the donor-bound exciton transition appears at 3.455 eV along with its phonon replica at 3.360 eV. Comparison with the value of 3.471 eV for strain-free GaN gives a 0.54 GPa tensile stress in the epilayer. While not wishing to be bound by any particular theory or principle, it is postulated that this is attributed to thermal mismatch with the Si substrate and possibly the small lattice mismatch with the HfN buffer layer. The inhomogenous broadening of the peak suggests nonuniform strain. The peak position and full-width at half-maximum (17 meV) are comparable to the best results reported for GaN on AlN/Si(111) using a single buffer layer process. A peak width as narrow as 5–6 meV has been reported for layers grown on AlGaN/GaN superlattices.

Although most GaN growth efforts on Si focused on the (111) surface due to its hexagonal symmetry, Si(001) is more commonly used in microelectronics. GaN grown on Si(001) often results in a mixture of wurtzite- and zincblende-structure grains, see B. Yang, A. Trampert, O. Brandt, B. Jenichen, and K. H. Ploog, *J. Appl. Phys.* 83, 3800 (1998), the contents of which are hereby incorporated by reference in their entirety. Contrast, x-ray scans for layers on HfN/Si (001) indicated pure wurtzite GaN with a single crystallite orientation in both the [0002] and [10-11] directions. The GaN(0002) plane was confirmed to be parallel to Si(004), but the in-plane orientation relationship has yet to be determined. The (0002) rocking curve width was 37 arcmin, and the intensity of the (10-11) reflection was too low to obtain a meaningful rocking curve width. The reduced structural quality is not surprising, since HfN(111) provides a hexagonal template for GaN nucleation while HfN(001) does not.

Figure 2:
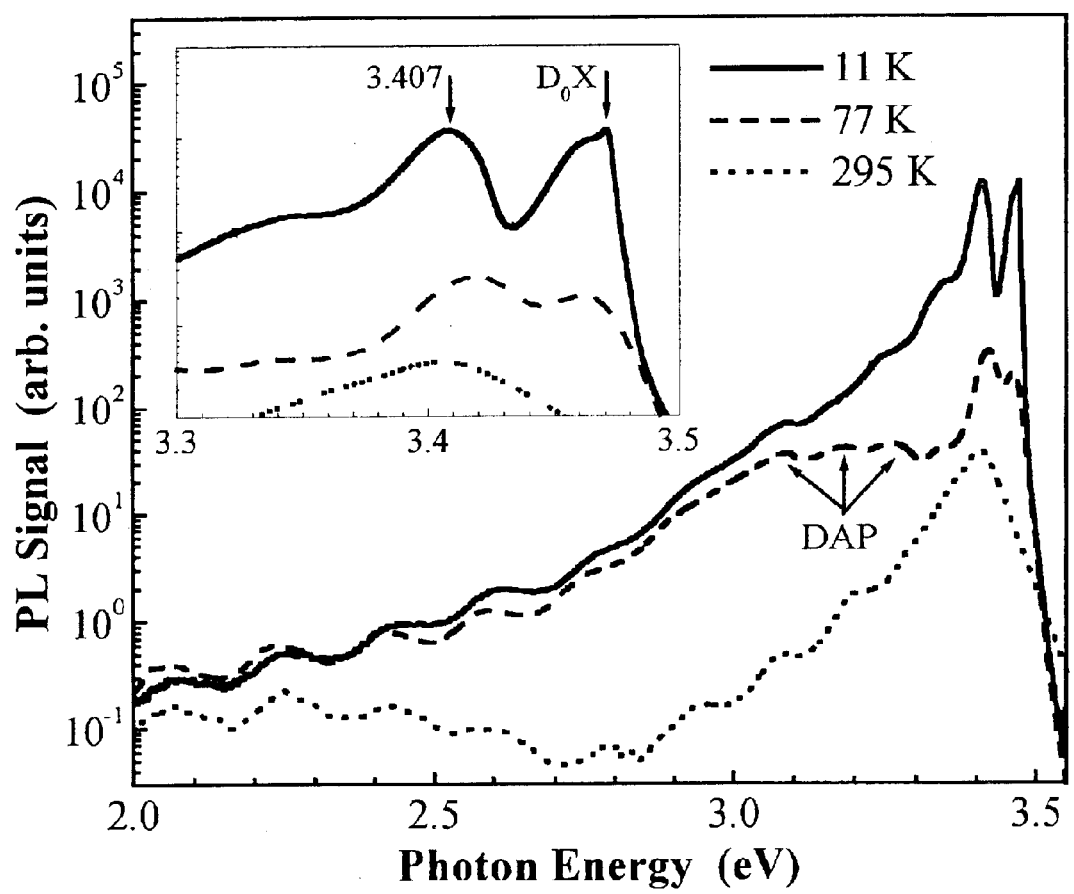
FIG. 2 shows a photoluminescence spectrum for a 1.2 $\mu$m GaN epilayer on HfN/Si(001).

A clearly different luminescence spectrum is observed for GaN on the (001) substrate orientation, as shown in FIG. 2. Compared with FIG. 1 the donor-acceptor pair transition is more prominent and the band-edge peak is broader. However, band-edge peak width of 72 meV at 295 K achieved for the epilayer on HfN/Si(001) compares favorably to the 82 meV reported for GaN on AlN/Si(001). The integrated luminescence intensities in FIGS. 1 and 2 are equal within experimental error for all measurement temperatures. Thus it is concluded that although HfN/Si(001) results in markedly worse GaN x-ray rocking curves than HfN/Si(111), the levels of non-radiative recombination for the two substrate orientations are comparable.

The most striking difference in the luminescence spectra for GaN films on the HfN(111) and (001) orientations is in the near-edge spectrum. While FIG. 1 shows a single donor-bound exciton line at low temperature, in FIG. 2 two broad peaks are observed at 3.465 and 3.407 eV, the former of which is resolved into narrow but overlapping peaks at 3.471 and 3.461 eV. The highest energy transition is assigned to the donor-bound exciton, while the others have yet to be identified conclusively. While not wishing to be bound by any particular theory or principle, it is believed that a peak often observed at 3.40–3.42 eV has been attributed to an exciton bound to a stacking fault. A high density of stacking faults might indeed be expected for wurtzite GaN grown on a cubic template.

From the considerably higher energy of the band-edge emission in FIG. 2 vs. FIG. 1 it is concluded that the tensile stress in GaN on HfN(001) is much less than that on HfN(111). The difference could be related to structural defects in the epilayer on HfN(001) that impede transfer of thermal strain from the substrate. The negligible strain in the 1.2 µm film suggests that crack-free GaN much thicker than 1.2 µm can be grown on this substrate orientation.

HfN(001) is a template for zincblende GaN due to its cubic symmetry and near-exact lattice match. Synthesis of the metastable zincblende phase on GaAs and 3C-SiC substrates has only been achieved for a limited growth parameter space involving the substrate temperature, Ga/N ratio, and deposition rate, see S. Yoshida, *Physica* E 7,907 (2000), the contents of which are hereby incorporated by reference in their entirety.

It will be appreciated by those skilled in the art that various modifications and extrapolations can be made in the process and article as described herein without departing from the spirit and scope of the invention.

We claim:

1. A composite wafer, comprising:
a substrate comprising Si,
a buffer layer comprising HfN (001) overlying said Si substrate, and
a GaN layer on said buffer layer.

2. The composite wafer as claimed in claim 1, wherein: there is more than one buffer layer comprising HfN.

3. The composite wafer as claimed in claim 2, wherein: there are two buffer layers comprising HfN overlying said Si substrate.

4. The composite wafer as claimed in claim 1, wherein: the buffer layer overlies directly on the Si substrate.

5. The composite wafer as claimed in claim 1, wherein: the substrate comprises Si (001).

6. The composite wafer as claimed in claim 5, wherein: the GaN layer comprises wurtzite GaN.

7. The composite wafer as claimed in claim 5, wherein: the HfN(001) layer lies directly on the Si(001) layer.

* * * * *